United States Patent
Nayler

(10) Patent No.: US 6,532,391 B1
(45) Date of Patent: Mar. 11, 2003

(54) AUTOMATIC GAIN CONTROL DEVICE AND METHOD FOR BASE BAND SIGNALING IN COMMUNICATIONS

(75) Inventor: Colin D. Nayler, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/552,869

(22) Filed: Apr. 20, 2000

(51) Int. Cl.[7] ............................................. G05B 13/02
(52) U.S. Cl. ........................... 700/37; 700/11; 700/34; 700/74; 341/139; 375/318; 375/345
(58) Field of Search ............................. 700/37, 11, 33, 700/34, 73, 74; 375/222, 232, 231, 317, 318, 345; 341/139; 709/218, 225, 226

(56) References Cited

U.S. PATENT DOCUMENTS

| | | | |
|---|---|---|---|
| 4,608,559 A | * 8/1986 | Friedman et al. | 340/825.5 |
| 5,093,660 A | * 3/1992 | Beauducel | 341/139 |
| 5,668,831 A | * 9/1997 | Claydon et al. | 375/232 |
| 6,282,237 B1 | * 8/2001 | Kaku et al. | 375/222 |

* cited by examiner

*Primary Examiner*—Paul P. Gordon
(74) *Attorney, Agent, or Firm*—Renner, Otto, Boisselle & Sklar, LLP

(57) ABSTRACT

A network receiver is configured for receiving a base band carrier signal from another network transceiver via a network medium. A variable gain amplifier generates an amplified base band signal. An A/D converter generates a sequence of sample values representing the base band signal in response to the amplified base band signal. A gain control circuit monitors the sequence of sample values for a plurality of monitoring intervals in a sample time period, determines a range for each monitoring interval, and determines a gain setting for the variable gain amplifier.

15 Claims, 3 Drawing Sheets

AUTOMATIC GAIN CONTROL DEVICE AND METHOD FOR BASE BAND SIGNALING IN COMMUNICATIONS

TECHNICAL FIELD

The present invention relates generally to network interfacing, and more particularly, to a system for gain adjustment within a base band signaling network interface.

BACKGROUND OF THE INVENTION

Networks serve the purpose of connecting many remotely spaced computing devices, such as desk top computers, file servers, printers etc, to each other so that valuable computing resources can be shared.

Communication protocols and standards for networks have been developed to standardize the way in which data frames are transmitted across the physical media of the network.

Ethernet is a popular network architecture based on carrier sense multiple access/collision detection (CSMA/CD) access control. The original Ethernet specification operated on a multi-drop bus topology in which all devices were coupled to a multi-drop bus in parallel. However, today the term Ethernet is often used to additionally refer to the IEEE 802.3 10BASE-T and 100BASE-T specifications which utilize a multi-drop logical bus topology although a star bus physical topology is used to improve reliability and facilitate troubleshooting.

In each of the 10BASE-T and 100BASE-T specifications, the number 10 or 100 refers to the transmission speed, the term "BASE" indicates that frames of data are being transmitted at base band, and the letter "T" specifies a twisted pair physical medium.

A star bus physical topology provides for each computing device to be coupled to a central hub via a dedicated communication link between the hub and the computing device. Each communication link comprises a transmit link and a receive link to provide for full duplex communications.

Because the system utilizes a logical multi-drop bus topology, the hub repeats frames to all nodes, and each device contends for access to the transmission medium as if all were connected along a single bus.

Because the transmissions are at base band, in theory, a receiver could simply sample the incoming signal with an A/D converter being clocked at the known base band data rate and in phase with the transmitter to recover the transmitted data.

However, the network topology tends to distort the data signal due to branch length, reflections, and electrical interference. As such, a variable gain amplifier is typically used. The amplifier conditions the signal, in accordance with a gain setting of the amplifier, prior to the A/D converter to assure that the signal parameters are within the dynamic range of the A/D converter.

Typically, the gain of the amplifier is set using a closed loop feedback system. A problem exists in that the circuitry comprising an analog closed loop feed back system can be large and costly. Furthermore, the circuits can be cumbersome to optimize for high data rate systems.

Therefore, based on recognized industry goals for faster data rate transmissions, reduced error rates, and reduced size and cost, what is needed is a device and method for adjusting input gain for an amplifier in a base band network receiver that does not suffer the disadvantages of known systems.

SUMMARY OF THE INVENTION

A first aspect of the present invention is to provide a network receiver configured for receiving a base band data signal from a network transmitter via a network medium. The network receiver comprises a variable gain input amplifier for amplifying a received signal according to one of a plurality of amplifier gain settings. The amplifier outputs an amplified base band signal. An A/D converter generates a sequence of digital sample values representing the amplified baseband signal. A range detection circuit determines a range of digital sample values during each of a plurality of monitoring intervals during a training time period and an automatic gain control circuit calculates one of the plurality of amplifier gain settings in response to at least one range value determined during the training time period and couples the amplifier gain settings to the variable gain input amplifier.

The network receiver may further include a physical layer control unit determining the training time period and the training time period may correspond to a time period during which the network transmitter is transmitting a pseudo noise signal.

The network receiver may further include a logarithmic look up table generating a log value representing the range and an adder calculating a difference between the log value and a reference level. A loop gain multiplier may multiplying the difference between the log value and the reference level by one of a plurality of loop gain constant values to generate a loop gain product.

The plurality of loop gain constants may include a high value useful for achieving rapid convergence during a first portion of the training time period, a low value useful for achieving convergence during a second portion of the training time period, and zero useful for locking the gain during a third portion of the training time period. An integrator may integrate a sequence of the loop gain products to generate the gain setting.

The range detection circuit may include a maximum sample value register storing the maximum digital sample value during the monitoring interval and a minimum sample value register storing the minimum digital sample value during the monitoring time interval. An adder may calculate the difference between the maximum sample value and the minimum sample value to generate the range.

A second aspect of the present invention is to provide method of determining a gain setting for a variable gain input amplifier in a receiver configured for receiving a base band signal from a network medium. The method comprises: a) digitizing an amplified received signal from the variable gain input amplifier to generate a sequence of digital sample values; b) determining a range of digital sample values during each of a plurality of monitoring intervals during a training time period; d) calculating an amplifier gain setting at least one range value determined during the training time period; and e)coupling the amplifier gain settings to the variable gain input amplifier. The training time period may correspond to a time period during which the network transmitter is transmitting a PN signal.

The method may further determining a logarithmic value representing the range and comparing the logarithmic value representing the range to a reference level value to generate a difference value. The difference value may be multiplied by one of a plurality of loop gain constant values to generate a loop gain product.

The plurality of loop gain constants may include a high value useful for achieving rapid convergence during a first portion of the training time period, a low value useful for achieving convergence during a second portion of the training time period, and zero useful for locking the gain during a third portion of the training time period. An integrator may integrate a sequence of the loop gain products to generate the gain setting.

The method may further include integrating a sequence of loop gain products to generate the gain setting and the step of determining the range of digital sample values may include determining the maximum digital sample value during the monitoring interval and determining the minimum sample value during the monitoring interval and calculating the range as the difference between the maximum sample value and the minimum sample value.

DESCRIPTION OF THE PREFERRED EMBODIMENTS

Figure 1:
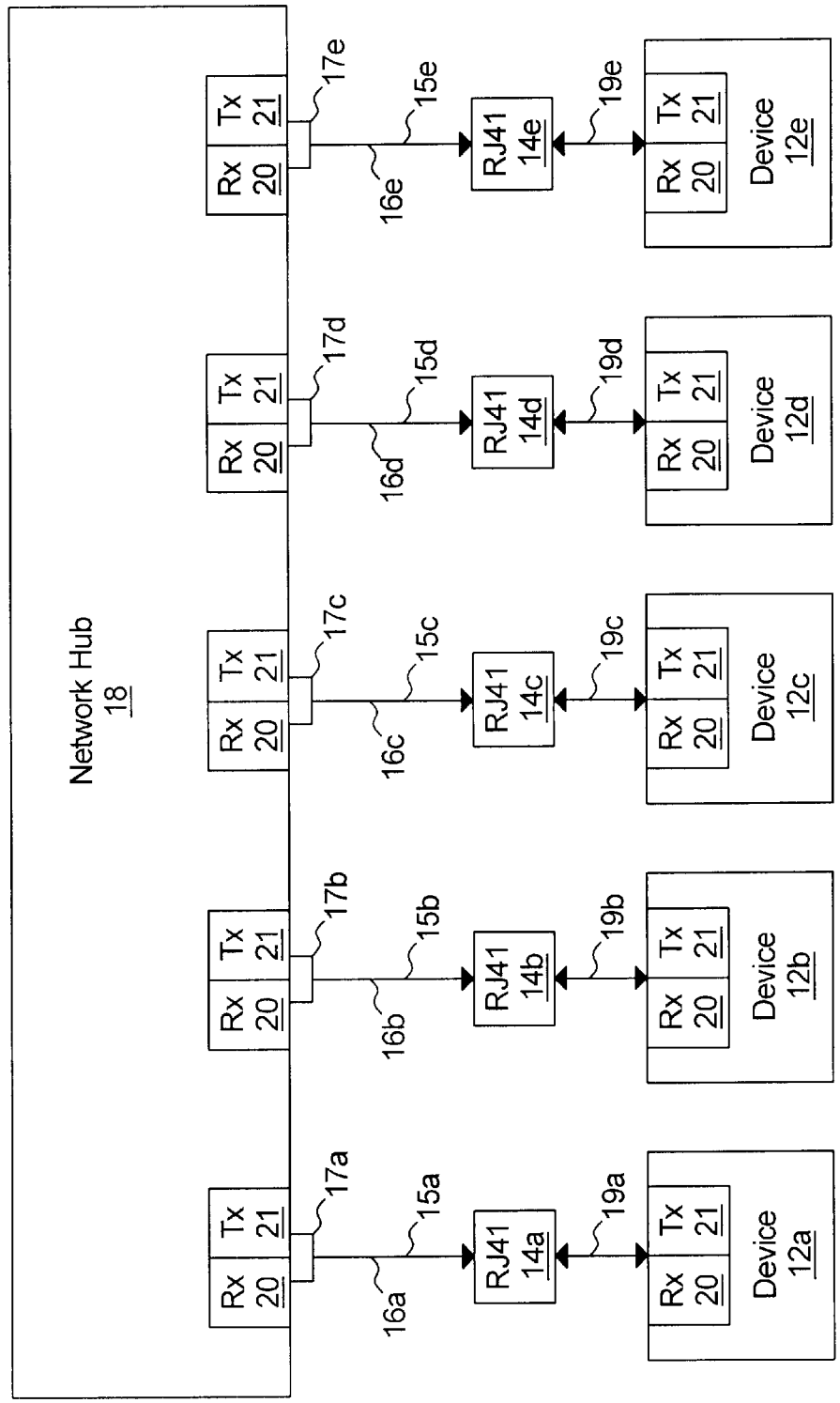
FIG. 1 is a block diagram of a network in accordance with one embodiment of this invention.

The present invention will now be described in detail with reference to the drawings. In the drawings, like reference numerals are used to refer to like elements throughout.

FIG. 1 is a diagram of a network 10 implemented according to an embodiment of this invention. The network 10 includes a network hub 18 interconnecting a plurality of remotely spaced network devices 12(a)–12(e). Each network device 12(a)–12(e) may be a personal computer, printer, server, gateway to another network, or other intelligent device useful for communicating with other network devices 12(a)–12(e) via the network 10.

Each network device 12(a)–12(e) is coupled to the hub by a dedicated network link 16(a)–16(e). Each network link 16(a)–16(e) comprises a network infrastructure link 15(a)–15(e) interconnecting a respective port 17(a)–17(e) on network hub 18 to a respective RJ 41 jack 14(a)–14(e) proximately positioned near its respective network device 12(a)–12(e). Further, each network link 16(a)–16(e) includes a device cable 19(a)–19(e) interconnecting a respective RJ 41 Jack 14(a)–14(e)—to its respective network device 12(a)–12(e).

The network 10 preferably is a 100BASE—T network implementation of the IEEE 802.3 specification or other faster implementation of a base band network. As such, the network 10 logically functions as a multi drop linear bus network in that the network hub 18 transmits frames from any device 12(a)–12(e) down each physical media link 16(a)–16(e), each device 12(a)–12(e) reads a logical address field in each frame for determining to which device 12(a)–12(e) the frame is addressed, and each device 12(a)–12(e) contends for the network 10 as if all were coupled to a one multi-drop bus.

While each network device 12(a)–12(e) communicates with other network devices 12(a)–12(e) via transmitting a frame logically addressed to the recipient device(s) on the network 10, physically, each network device 12(a)–12(e) is constrained to communicate, via its physical media link 16(a)–16(e), with the network hub 18 only.

The IEEE 802.3 specification provides several specifications for the physical media links 16(a)–16(e), in the preferred embodiment, each physical media link 16(a)–16(e) (e.g. each of the network infrastructure links 15(a)–15(e) and each of the device cables 19(a)–19(e)) is a Category 5 cable comprising four conductors arranged as two twisted pairs.

A first pair operates to transmit frames from the network hub 18 to the device 12. The second pair operates to transmit frames from the device 12 to the network hub 18. It should be appreciated that the first pair, which operates to transmit frames from the network hub 18 to the device 12, can be referred to as the "transmit pair" from the perspective of the network hub 18 and as the "receive pair" from the perspective of the device 12. Similarly, the second pair, which operates to transmit frames from the device 12 to the network hub 18, can be referred to as the "transmit pair" from the perspective of the device 12 and as the "receive pair" from the perspective of the network hub 18. Therefore, the terms "transmit pair" and "receive pair" as used herein, will mean the appropriate pair as viewed from the perspective of the particular device, or network hub, being discussed.

Each of the devices 12(a)–12(e) includes a network transmitter 21 coupled to the transmit pair and a network receiver 20 coupled to the receive pair. Similarly, the network hub 18 includes, for each device port 17(a)–17(e), a network transmitter 21 coupled to the transmit pair and a network receiver 20 coupled to the receive pair.

Figure 2:
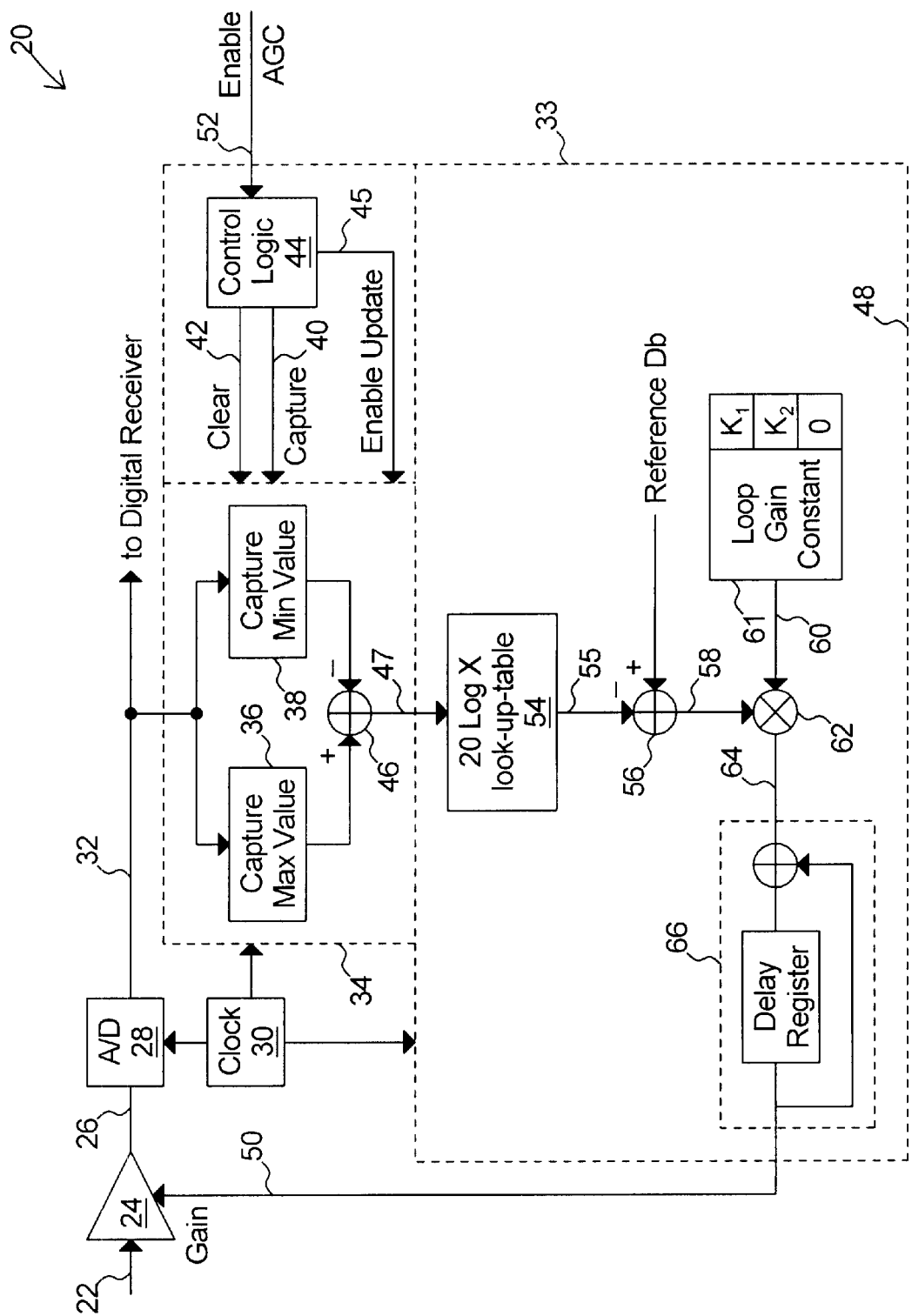
FIG. 2 is a block diagram of a gain control circuit useful in determining amplifier gain setting in accordance with one embodiment of this invention.

Referring to FIG. 2, a portion of the receiver 20 is shown in more detail. Receiver circuit 20 includes a variable gain input amplifier 24 receiving an input signal on line 22 which is an analog representation of the differential voltage signal on the receive pair. The variable gain amplifier 24 generates an amplified voltage signal on line 26 in response to the input signal on line 22 and a discrete gain setting as set by a gain select signal on line 50.

As discussed previously, the network topology tends to distort the data signal due to branch length, reflections, and electrical interference. As such, the voltage differential measured at the receiving device may not be the same differential as modulated by the transmitting device. Therefore, the variable gain input amplifier 24, as controlled by the gain select signal on line 50, is used to condition the signal in an attempt to recover the full dynamic range of the differential voltage signal originally transmitted.

An A/D converter 28 is driven at the base band frequency by a clock 30 and receives the amplified signal on line 26 and generates a sequence of digital sample values representing the base band data signal on line 32. A digital receiver (not shown) receives the digital sample values, recovers the originally transmitted data, and makes the data available to higher level applications.

An automatic gain control (AGC) circuit 33 is also coupled to line 32 for receiving the digital sample values from the A/D converter 28 and generating the gain select signal on line 50 for controlling the variable gain input amplifier 24. The AGC control circuit 33 includes a control logic circuit 44, a range capture circuit 34, and a gain update circuit 48.

The control logic circuit 44 monitors an enable AGC signal from a physical layer controller (not shown) on line 52. The presence of the enable AGC signal on line 52, indicates a training period during which the AGC circuit 33 becomes operational for monitoring the digital sample values on line 32 and updating the gain select signal on line 50. In the preferred embodiment, the enable AGC signal is generated by the physical layer controller during a time period in which a pseudo noise code, as opposed to frames, is being received on the receive pair.

The range capture circuit 34 operates under control of the control logic circuit 44 for determining the peak to peak amplitude of the digital sample values on line 32 to generate a range value on line 47 representative of whether the amplified signal on line 26 utilizes the full dynamic range of the A/D converter 28. The gain update circuit 48 also operates under control of the control logic 44 and receives the range value on line 47 and updates the gain select signal, if necessary, to a new value that better enables the amplified signal on line 26 to utilize the dynamic range of the A/D converter 28.

In the preferred embodiment, the range capture circuit 34 includes a maximum value register 36 which stores the maximum digital sample value on line 32 during a monitoring interval. At each clock cycle, as defined by the clock 30 operating at the base band frequency, if the sample value is greater than that stored in the maximum value register 36, the maximum value register 36 is updated to the new maximum value. Similarly, the minimum value register 38 stores the minimum digital sample value on line 32 during the monitoring interval. At each clock cycle, if the sample value is less than that stored in the minimum value register 38, the minimum value register 38 is updated to the new minimum value.

The presence of a capture signal on line 40 from the control logic circuit 44 defines the monitoring interval during which the maximum value register 36 and the minimum value register 38 capture the maximum and minimum digital sample values. At the end of the monitoring interval, as indicated by an enable update signal from the control logic circuit 44 on line 45, an adder 46 calculates the range value by calculating the difference between the maximum value stored in the maximum value register 36 and the minimum value stored in the minimum value register 38. A clear signal on line 42 from the control logic circuit 44 clears the maximum value register 36 and the minimum value register 38 to prepare each for the next monitoring interval.

Preferably the monitoring interval is of a duration during which enough sample values are clocked onto line 32 (FIG. 3) to statistically assure that the maximum value register 36 and the minimum value register 38 accurately reflect the peak to peak maxima and minima of the sequence of sample values.

The gain update circuit 48 includes a 20 log(x) look up table which receives the range value on line 47 from the adder 46 and outputs the 20 log(x) function value of the range value on line 55. An adder 56 operates to compare the 20 log(x) function value to desired reference level in decibel units and output a difference on line 58. A multiplier operates to multiply the difference by a loop gain constant on line 60 to generate a loop gain product on line 64.

The loop gain constant is a value generated by a loop gain constant circuit 61 which functions as a state machine in accordance with the following state machine rules:

Select K1 for a first group of monitoring intervals in the training time period.

Select K2 for a second group of monitoring intervals in the training time period.

Select K3=0 to lock the gain and disable gain update for the remainder of the training time period.

Preferably, the value K1 is a large value useful for achieving rapid convergence during a first portion of the training time period. The value K2 is a low value useful for achieving convergence during a second portion of the training time period. The value K3 of zero is useful for locking the gain during a final portion of the training time period and during time periods that are not part of the training time period.

A loop gain product integrator 66 receives the loop gain product on line 64 and integrates a sequence of loop gain product values to generate the gain setting on line 50, which as disused previously is coupled back to the variable gain amplifier 24.

Figure 3:
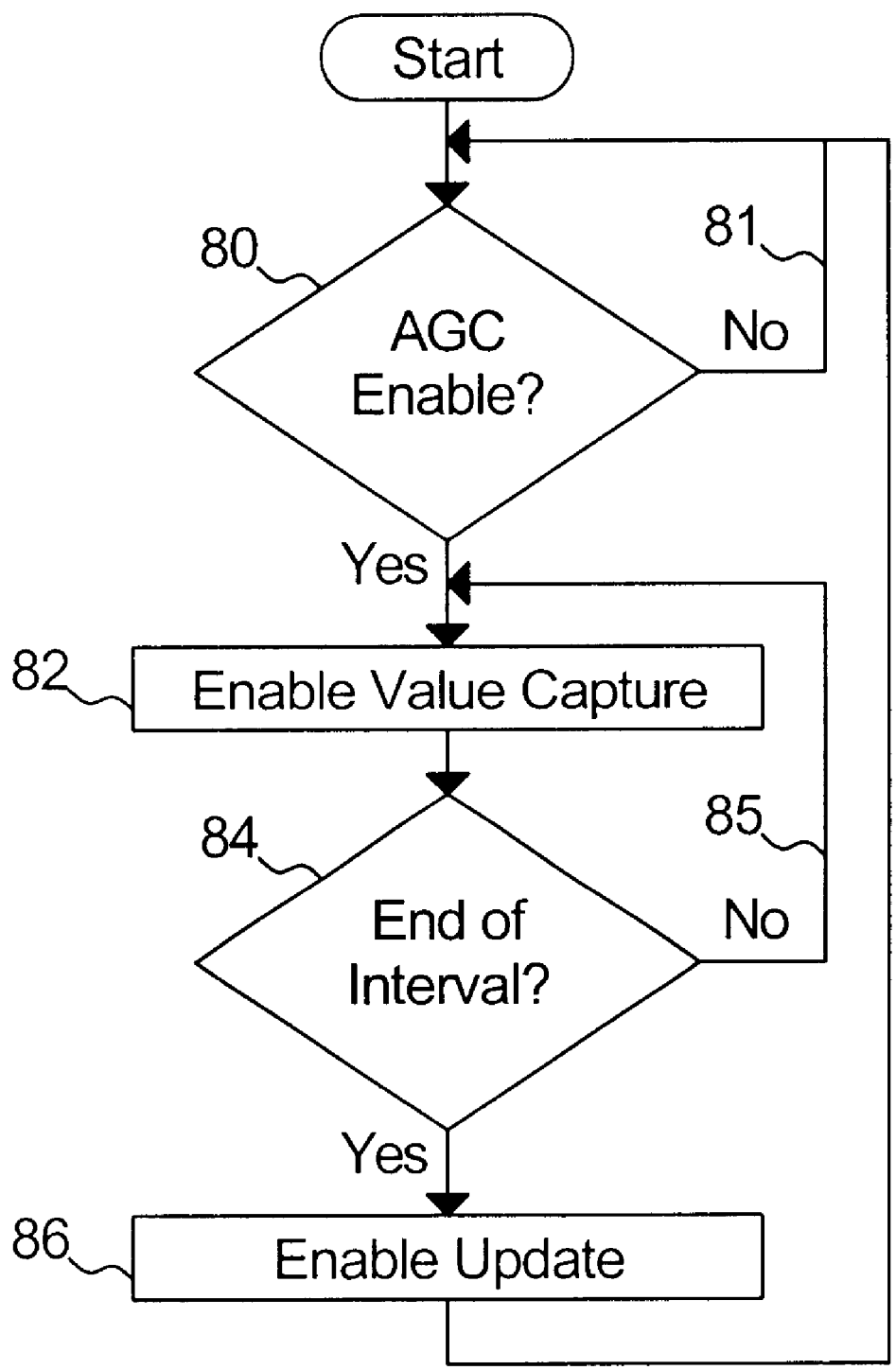
FIG. 3 is a flowchart showing exemplary operation of the gain control circuit of FIG. 2.

Referring to FIG. 3, a flow chart showing exemplary operation of the control logic circuit 44 (FIG. 2) is shown. At step 80, a control logic circuit determines whether it has received an AGC enable signal from the physical layer controller. If the gain enable signal is not received at step 80 the control logic simply waits for such signal as indicated by flow chart loop 81.

When an AGC enable signal is received at step 80, the control logic circuit initiates a monitoring interval at step 82 by generating the clear signal followed by the capture signal.

At step 84, the control logic circuit determines whether the end of the monitoring interval has been reached. If at step 84, the end of the interval is not reached, the enable capture signal is maintained as represented by flow chart loop 85. Alternatively, when the end of the monitoring interval is reached at step 84, the enable capture signal is discontinued and the enable update signal is initiated at step 86.

As discussed previously with respect to FIG. 2, the enable update signal initiates the calculation of the range value in the adder 46 which, in turn, initiates the updating of the gain select signal on line 50.

It should be appreciated that the above described device and methods provide for a device and method for selecting an variable gain input amplifier gain setting for a receiver operating in a base band network environment by monitoring the sample values as measured by the input A/D converter.

Although the invention has been shown and described with respect to certain preferred embodiments, it is obvious that equivalents and modifications will occur to others skilled in the art upon the reading and understanding of the specification. For example, while the exemplary embodiment describes capturing a maximum sample value and a minimum sample value to calculate the range value, other range calculation techniques such as capturing the maximum value of the absolute value of each sample can as readily be used. The present invention includes all such equivalents and modifications, and is limited only by the scope of the following claims.

What is claimed is:

1. A network receiver configured for receiving a base band data signal from a network transmitter via a network medium, the network receiver comprising:

a) a variable gain input amplifier for amplifying a received signal according to one of a plurality of amplifier gain settings and outputting an amplified base band signal;

b) an A/D converter-generating a sequence of digital sample values representing the amplified baseband signal;

c) a range detection circuit determining a range of digital sample values during each of a plurality of monitoring intervals during a training time period; and d) an automatic gain control circuit calculating one of the plurality of amplifier gain settings in response to at least one range value determined during the training time period and coupling the amplifier gain settings to the variable gain input amplifier.

2. The network receiver of claim 1, further including a physical layer control unit determining the training time period.

3. The network receiver of claim 2, wherein the training timer period is a period during which the network transmitter is transmitting a pseudo noise signal.

4. The network receiver of claim 3, further including a logarithmic look up table generating a log value representing the range and an adder calculating a difference between the log value and a reference level.

5. The network receiver of claim 4, further including a loop gain multiplier multiplying the difference between the log value and the reference level by one of a plurality of loop gain constant values to generate a loop gain product.

6. The network receiver of claim 5, wherein the plurality of loop gain constant values include a high value useful for achieving rapid convergence during a first portion of the training time period, a low value useful for achieving convergence during a second portion of the training time period, and zero useful for locking the gain during a third portion of the training time period.

7. The network receiver of claim 6, further including an integrator for integrating a sequence of the loop gain products to generate the gain setting.

8. The network receiver of claim 7, wherein the range detection circuit includes a maximum sample value register storing the maximum digital sample value during the monitoring interval and a minimum sample value register storing the minimum digital sample value during the monitoring time interval and an adder calculating the difference between the maximum sample value and the minimum sample value to generate the range.

9. A method of determining a gain setting for a variable gain input amplifier in a receiver configured for receiving a base band signal from a network medium, the method comprising:

a) digitizing an amplified received signal from the variable gain input amplifier to generate a sequence of digital sample values;

b) determining a range of digital sample values during each of a plurality of monitoring intervals during a training time period;

d) calculating an amplifier gain setting at least one range value determined during the training time period; and e) coupling the amplifier gain settings to the variable gain input amplifier.

10. The method of claim 9, further including determining the training time period to correspond to a time period during which a network transmitter is transmitting a PN signal.

11. The method of claim 10, further including determining a logarithmic value representing the range and comparing the logarithmic value representing the range to a reference level value to generate a difference value.

12. The method of claim 11, further including multiplying the difference value by one of a plurality of loop gain constant values to generate a loop gain product value.

13. The method of claim 12, wherein plurality of loop gain constant values include a high value useful for achieving rapid convergence during a first portion of the training time period, a low value useful for achieving convergence during a second portion of the training time period, and zero useful for locking the gain during a third portion of the training time period.

14. The method of claim 13, further integrating a sequence of the loop gain product values to generate the gain setting.

15. The method of claim 14, wherein the step of determining the range of digital sample values includes determining a maximum digital sample value during the monitoring interval and determining a minimum sample value during the monitoring interval and calculating the range as the difference between the maximum sample value and the minimum sample value.

* * * * *